(12) United States Patent
Lacey et al.

(10) Patent No.: US 8,124,527 B2
(45) Date of Patent: Feb. 28, 2012

(54) CMP PROCESS FLOW FOR MEMS

(75) Inventors: Joseph Damian Gordon Lacey, Milpitas, CA (US); Thomas L. Maguire, Sunnyvale, CA (US); Vikram Joshi, Mountain View, CA (US); Dennis J. Yost, Los Gatos, CA (US)

(73) Assignee: Cavendish Kinetics, Inc., San Jose, CA (US)

( * ) Notice: Subject to any disclaimer, the term of this patent is extended or adjusted under 35 U.S.C. 154(b) by 0 days.

(21) Appl. No.: 13/036,201

(22) Filed: Feb. 28, 2011

(65) Prior Publication Data

US 2011/0212593 A1    Sep. 1, 2011

Related U.S. Application Data

(60) Provisional application No. 61/309,387, filed on Mar. 1, 2010.

(51) Int. Cl.
 *H01L 21/4763* (2006.01)
(52) U.S. Cl. ... 438/637; 438/128; 438/618; 257/E21.58; 257/E21.585
(58) Field of Classification Search ............... 438/196, 438/599; 257/E21.35, E21.532, E21.536
See application file for complete search history.

(56) References Cited

U.S. PATENT DOCUMENTS

| 6,054,745 | A | 4/2000 | Nakos et al. |
| 6,284,560 | B1 | 9/2001 | Jech, Jr. et al. |
| 2007/0004096 | A1 | 1/2007 | Heuvelman |
| 2007/0077722 | A1* | 4/2007 | Won ........................ 438/398 |
| 2009/0275163 | A1 | 11/2009 | Lacey et al. |

FOREIGN PATENT DOCUMENTS

| EP | 1344746 A2 | 9/2003 |
| WO | WO-2007/117198 A1 | 10/2007 |

OTHER PUBLICATIONS

Search Report and Written Opinion for PCT/US2011/026167 dated Nov. 2, 2011.

* cited by examiner

*Primary Examiner* — Cheung Lee
(74) *Attorney, Agent, or Firm* — Patterson & Sheridan, LLP

(57) ABSTRACT

The present invention generally relates to the formation of a micro-electromechanical system (MEMS) cantilever switch in a complementary metal oxide semiconductor (CMOS) back end of the line (BEOL) process. The cantilever switch is formed in electrical communication with a lower electrode in the structure. The lower electrode may be either blanket deposited and patterned or simply deposited in vias or trenches of the underlying structure. The excess material used for the lower electrode is then planarized by chemical mechanical polishing or planarization (CMP). The cantilever switch is then formed over the planarized lower electrode.

20 Claims, 13 Drawing Sheets

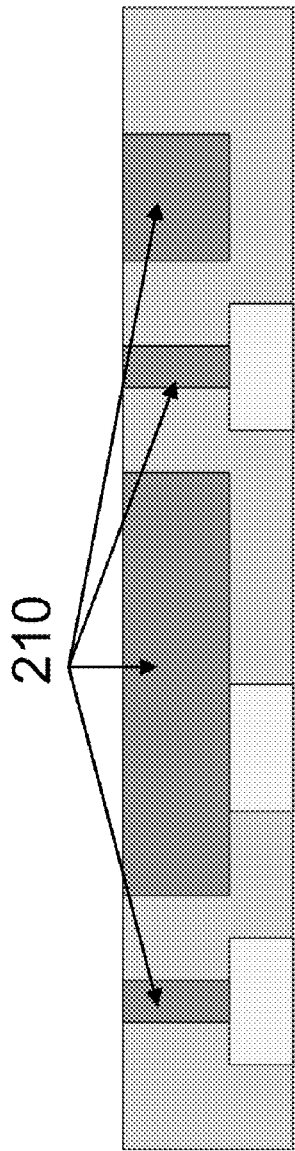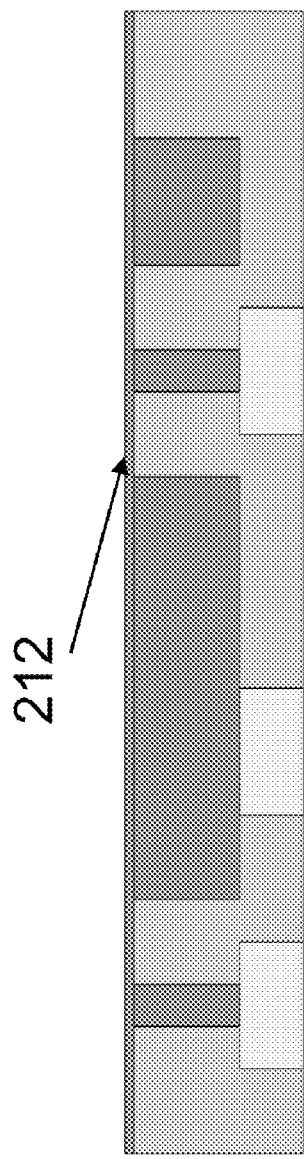
Figure 2C
Figure 2D

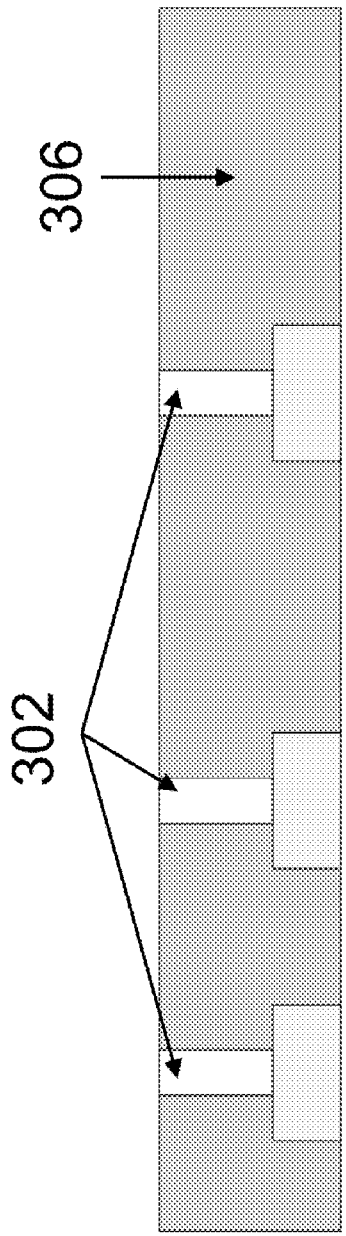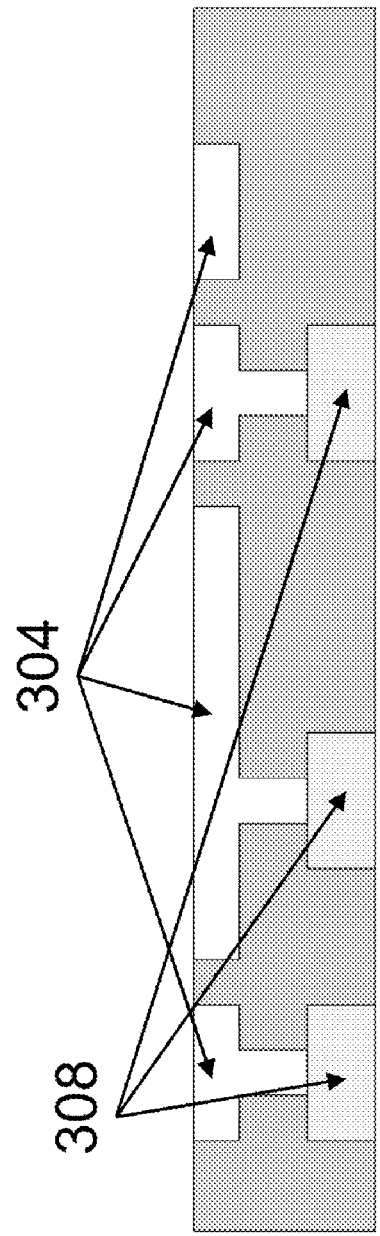
Figure 3A
Figure 3B

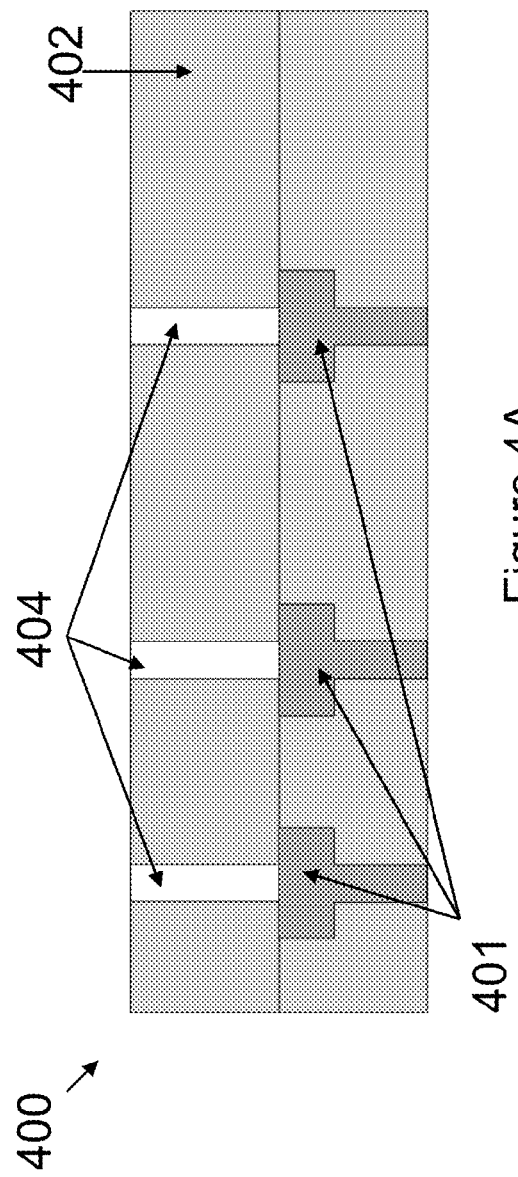
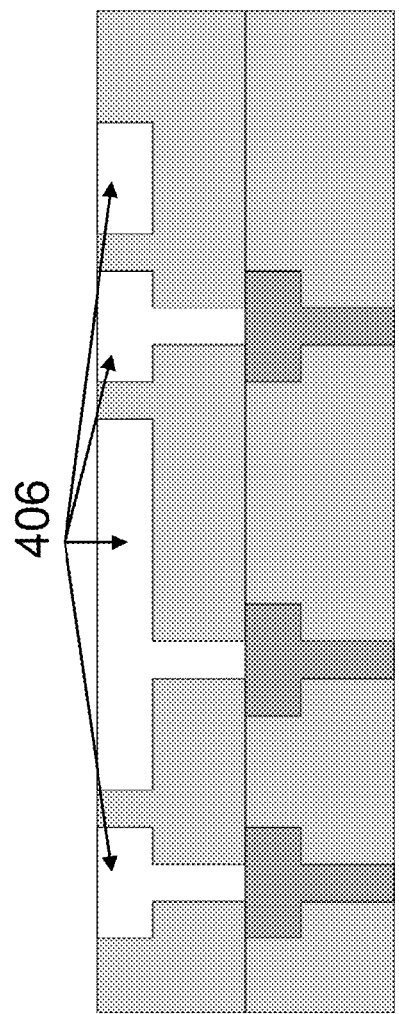
Figure 4A
Figure 4B

CMP PROCESS FLOW FOR MEMS

CROSS-REFERENCE TO RELATED APPLICATIONS

This application claims benefit of U.S. Provisional Patent Application Ser. No. 61/309,387 (CK065L), filed Mar. 1, 2010, which is herein incorporated by reference.

BACKGROUND OF THE INVENTION

1. Field of the Invention

Embodiments of the present invention generally relate to the formation of a micro-electromechanical system (MEMS) utilizing a chemical mechanical polishing or planarization (CMP) process to form a planar lower electrode configuration enabling planar MEMS technologies.

2. Description of the Related Art

Traditional MEMS technologies often utilize chemical vapor deposition (CVD) or furnace processes to deposit sacrificial films. The sacrificial films are blanket deposited over the underlying structure which typically does not have a planar underlying topography. The sacrificial films have a tendency to follow the contours of the underlying structures which compromises the structural integrity of the MEMS device due to compromises that must be made in the MEMS design to accommodate the sacrificial film formation. The MEMS layer will then produce a conformal coating on the sacrificial layer. In particular, the structural integrity of the MEMS device may be compromised by the efforts to obtain a planarized sacrificial layer. Even those MEMS processes that utilize a planarizing spin-on film for the sacrificial layers suffer from having to planarize over the underlying electrode topographies.

Therefore, there is a need in the art for a method to fabricate a MEMS device in which the lower electrode is planarized without compromising the structural integrity of the MEMS device.

SUMMARY OF THE INVENTION

The present invention generally relates to the formation of a MEMS cantilever switch in a complementary metal oxide semiconductor (CMOS) back end of the line (BEOL) process. It is to be understood that the switches discussed herein may be resistive switches or capacitance switches. The cantilever switch is formed in electrical communication with a lower electrode in the structure. The lower electrode may be either blanket deposited and patterned or simply deposited in vias or trenches of the underlying structure. The excess material used for the lower electrode is then planarized by CMP. The cantilever switch is then formed over the planarized lower electrode.

In one embodiment, a method is disclosed. The method includes depositing one or more electrically conductive layers over a substrate. The substrate has a first dielectric layer with vias extending therethrough to underlying interconnect structures. The one or more electrically conductive layers fill the vias. The method also includes patterning the one or more electrically conductive layers to expose at least a portion of the first dielectric layer. The method additionally includes depositing a second dielectric layer over the patterned one or more electrically conductive layers and the exposed first dielectric layer. The method also includes chemical mechanical polishing the second dielectric layer and at least a portion of the patterned electrically conductive layers to create polished electrodes. The method additionally includes encapsulating the first dielectric layer and the polished electrodes, and forming a cantilever device that is in electrical contact with at least a portion of the polished electrodes.

In another embodiment, a method is disclosed. The method includes forming a plurality of vias through a dielectric layer formed above a substrate to expose one or more interconnect elements. The method also includes modifying one or more vias of the plurality of vias to form one or more trenches. The method additionally includes depositing one or more electrically conductive layers over the dielectric layer, over the exposed one or more interconnect elements, and within both the plurality of vias and the one or more trenches. The method also includes chemical mechanical polishing the one or more electrically conductive layers to expose at least a portion of the dielectric layer and to form MEMS electrodes. The method additionally includes encapsulating the dielectric layer and the MEMS electrodes. The method also includes forming a cantilever device that is in electrical contact with at least one of the MEMS electrodes.

In another embodiment, a method is disclosed. The method includes forming one or more vias thorough a first dielectric layer to expose one or more interconnect elements. The method also includes forming one or more trenches within the first dielectric layer such that the one or more trenches and one or more vias are connected. The method additionally includes depositing one or more electrically conductive layers within the one or more vias with a first material, the one or more trenches, and over the first dielectric layer. The method also includes chemical mechanical polishing the one or more electrically conductive layers to expose the first dielectric layer and to form one or more MEMS electrodes within the one or more trenches. The method additionally includes encapsulating the first dielectric layer and the one or more MEMS electrodes. The method also includes forming a cantilever device that is in electrical contact with the one or more MEMS electrodes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2E show a MEMS cantilever device at various stages of production according to another embodiment.

FIGS. 3A-3F show a MEMS cantilever device at various stages of production according to another embodiment.

FIGS. 4A-4E show a MEMS cantilever device at various stages of production for a copper BEOL process.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally relates to the formation of a MEMS cantilever switch in a complementary metal oxide semiconductor (CMOS) back end of the line (BEOL) process.

The cantilever switch is formed in electrical communication with a lower electrode in the structure. The lower electrode may be either blanket deposited and patterned or simply deposited in vias or trenches of the underlying structure. The excess material used for the lower electrode is then planarized by CMP. The cantilever switch is then formed over the planarized lower electrode.

The embodiments disclosed herein describe the formation of a MEMS cantilever switch in a CMOS BEOL. The embodiments illustrate several different fabrication options in an aluminium or copper BEOL. However, this same approach can be utilized in any BEOL that can employ CMP as a planarization method.

Figure 1A:
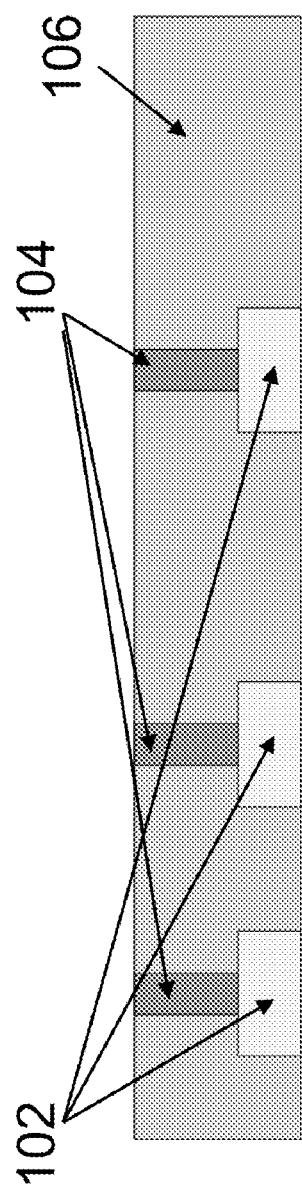
FIGS. 1A-1G show a MEMS cantilever device at various stages of production according to one embodiment.

The first embodiment is illustrated in FIGS. 1A-1G. The starting point is illustrated in FIG. 1A, where one or more interconnect elements 102, such as a metal or other electrically conductive materials, are exposed through vias 104 formed through the surrounding inter-metal dielectric layer 106. In one embodiment, the one or more interconnect elements 102 may comprise a metal selected from the group consisting of titanium, copper, aluminium, tungsten, and combinations thereof. It is to be understood that the interconnect elements 102 may comprise other materials other than metals such as titanium nitride. The vias 104 may be formed by patterning the inter-metal dielectric layer 106 to remove the dielectric material and leave the vias. The inter-metal dielectric layer 106 may comprise any suitable dielectric material utilized in conventional CMOS BEOL processes such as silicon nitride, silicon oxides, silicon oxynitride, and combinations thereof. Once the vias 104 have been formed, the vias 104 may be lined with an electrically conductive material such as titanium, aluminium, tungsten, copper, titanium nitride, and combinations therefore. The particular material for lining the vias 104 may comprise any conventional material used to fill vias in CMOS BEOL structures.

Figure 1B:
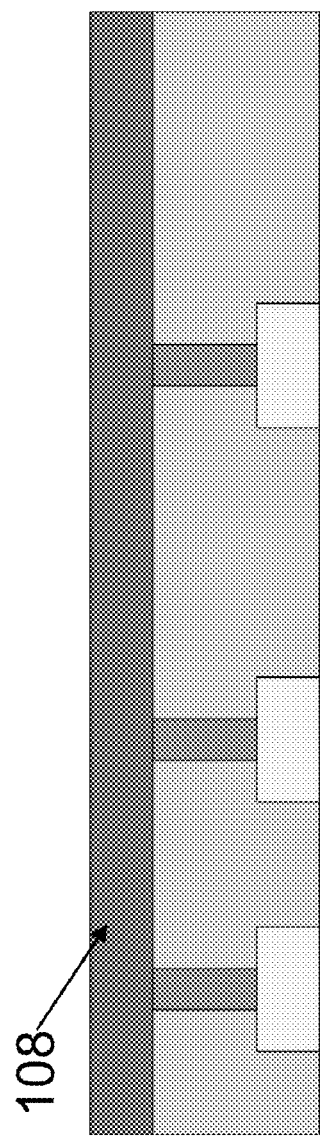

In FIG. 1B, the bottom electrode material 108 is deposited in bulk within the lined vias and over the inter-metal dielectric layer 106. In one embodiment, the bottom electrode material 108 may comprise titanium nitride. It is to be understood that any conductive material that is capable of being CMP'ed can be utilized, including multi stack technologies that have been correctly engineered. In one embodiment, the bottom electrode material 108 may comprise a Ti/TiN stack. The thickness of the bottom electrode material 108 is tuned for the subsequent CMP. The bottom electrode material 108 is chosen to have a desired resistivity. In one embodiment, the bottom electrode material 108 comprises a single layer of a predetermined material such as titanium nitride. In another embodiment, the bottom electrode material 108 may be a composite film made of multiple layers in a stack that collectively have the desired resistivity. For example, the stack may comprise a titanium/titanium nitride/aluminium copper/titanium nitride stack. The final thickness of the topmost layer of the stack should be thick enough to withstand the subsequent CMP step. In the CMP process, a portion of the bottom electrode material 108 will be removed. Therefore, the bottom electrode material 108 should be thick enough such that sufficient material remains to function as the bottom electrode. In one embodiment, the topmost layer (i.e., titanium nitride in the above stack example) may have a thickness of between about 2000 Angstroms and about 3500 Angstroms. In the embodiment where the bottom electrode material 108 is a single layer, the bottom electrode material 108 may be deposited to a thickness of between about 2000 Angstroms to about 3500 Angstroms.

The thickness of the bottom electrode material 108 should be controlled to meet certain electrical requirements, such as sheet resistance. When the bottom electrode material 108 comprises a multi-layer stack comprising aluminium copper and titanium nitride thereover, the aluminium copper layer provides a specific resistance for the electrode while the titanium nitride functions as a conductive etch-stop layer that has a much higher resistance than aluminium (thus, the aluminium defines the electrode's resistance regardless of the titanium nitride thickness). Suitable thicknesses for the titanium nitride may be between about 2000 Angstroms and about 3500 Angstroms, such as about 3000 Angstroms. During the polishing, most if not all of the titanium nitride will be removed to leave only the aluminium copper. Suitable thicknesses for the aluminium copper layer may be between about 5000 Angstroms and about 9000 Angstroms, such as about 6500 Angstroms. If the resistance needs to be changed, the thickness of the aluminium copper and the titanium nitride may be increased to about 10000 Angstroms and 4000-5000 Angstroms respectively.

When the stack deposited is an aluminium/copper/titanium nitride stack, the titanium nitride may function as an etch stop layer. Thus, the titanium nitride is a conductive etch stop material. The aluminium-copper is the electrode while the titanium nitride protects the actual damascene lower electrode (i.e., the Al—Cu) because the actual electrode cannot be CMP'ed easily. The benefit of using titanium nitride as an etch stop material that is deposited over the aluminium-copper damascene structure is that the etch stop material is conductive while additionally protecting the actual electrode. Therefore, the desired electrically conductivity may be maintained and the electrode material is not damaged. Another benefit is that the aluminium-copper material for the electrode is not easily CMP'ed which would render etching back the electrode material during the CMP step quite difficult. By utilizing aluminium copper as the electrode material and then stacking titanium nitride thereon, the titanium nitride, which is more easily CMP'ed, can be planarized back during the CMP of the dielectric layer. Thus, the titanium nitride provides the flexibility for the CMP step that the aluminium-copper material for the electrode simply cannot do. It is to be understood that the conductive etch stop layer does not need to be titanium nitride, but, rather, can be a conductive material that will perform the same function exemplified by titanium nitride.

Figure 1C:
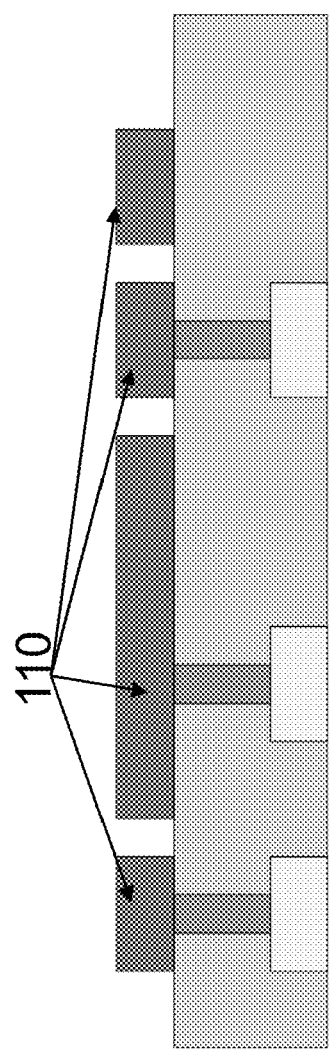

The bottom electrode material 108 is then patterned to form the final electrode geometries for the electrodes 110 for the MEMS device as shown in FIG. 1C. The patterning may occur by conventional patterning performed in CMOS BEOL processes. For example, a photoresist may be deposited and developed to create a mask. The portions of the bottom electrode material 108 that are not covered by the mask may then be exposed to an etchant to remove portions of the bottom electrode material 108. The mask may then be removed such that the final electrode geometries remain.

Figure 1D:
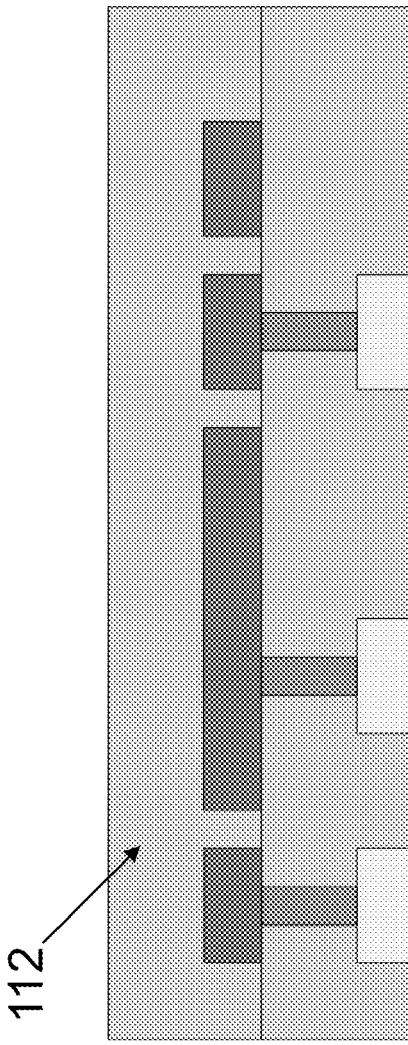

In the next fabrication stage, FIG. 1D, a second dielectric layer 112 may be deposited. In one embodiment, the second dielectric layer 112 may comprise $SiO_2$. In another embodiment, the second dielectric layer 112 may comprise PE-TEOS, HDP $SiO_2$ or whatever the normal AlCu BEOL material is for gap fill prior to CMP. The thickness of the second dielectric layer 112 is dependent upon the etch selectivity between the bottom electrode material 108 and the second dielectric layer 112. For example, in one embodiment, the bottom electrode material 108 may comprise TiN while the second dielectric layer may comprise $SiO_2$. In the example, the ratio of the thickness of $SiO_2$ to TiN is 3:1 due to the selectivity of the chemical used for CMP. The thickness of the second dielectric layer 112 is controlled to provide sufficient gap fill and polish marginality, such as between about 1 to about 1.5 times the height of the electrodes 110. For example, a thickness of a HDP-oxide may be between about 13000 Angstroms and about 25000 Angstroms, such as about 14000 Angstroms or about 20000 Angstroms. The second dielectric layer 112 is deposited to ensure that no void or gap is formed between the electrodes 110. The second dielectric layer 112 may be deposited in a single step deposition of PE-SiO$_2$, HDP SiO$_2$ or PE-TEOS. Alternatively, the second dielectric layer 112 may be deposited at a multi-layer structure such as a deposition of HDP-SiO$_2$ followed by a deposition of PE-TEOS such as is commonly employed in aluminium BEOL CMOS interconnects. In one embodiment where a multi-layer structure is utilized as the second dielectric layer 112, the bottom layer may have a thickness of between about 1 micrometer to about 2 micrometers, such as about 1.4 micrometers, to adequately fill the gaps between adjacent electrodes 110.

Figure 1E:
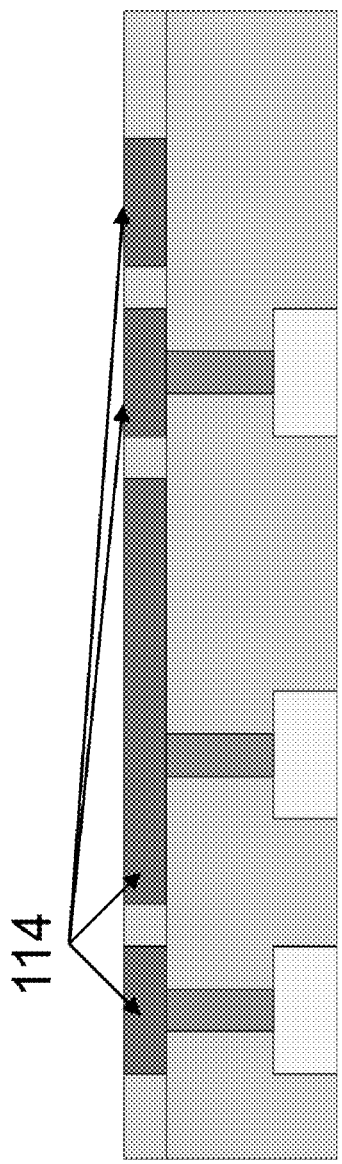

The next step of the process, shown in FIG. 1E, is to perform the oxide damascene step through CMP. The target thickness for the electrodes 110 post CMP is between about 2000 Angstroms and about 2500 Angstroms. CMP is performed using standard oxide CMP slurries with an ammonia scrub post CMP. During the CMP process, both a portion of the second dielectric layer 112 as well as a portion of the electrodes 110 is removed leaving the polished electrodes 114. In one embodiment, between about 500 Angstroms and about 1000 Angstroms of the electrodes 110 are removed.

Figure 1F:
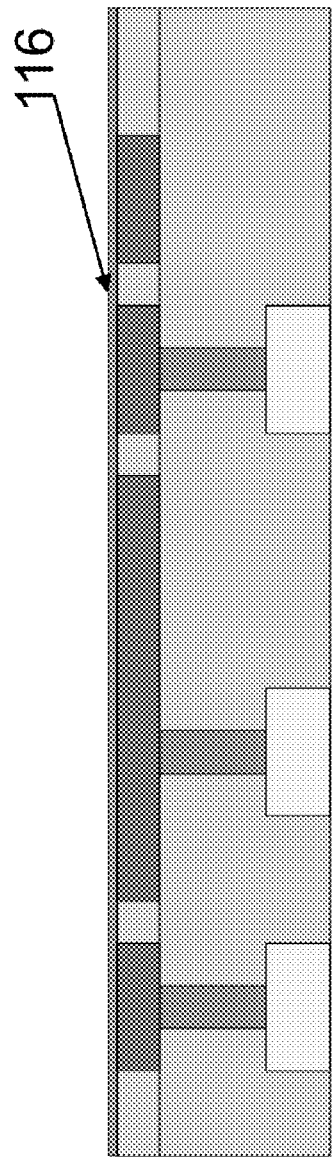

The final polished electrodes 114 are then encapsulated by an encapsulating layer 116 as shown in FIG. 1F. In one embodiment, the encapsulating layer 116 may comprise an insulating material. The encapsulating layer 116 may be deposited by conventional deposition methods such as plasma enhanced chemical vapour deposition (PECVD) and spin-on dielectric deposition to name a few. In another embodiment, the encapsulating layer 116 may comprise a thin PECVD SiO$_2$ layer.

Figure 1G:
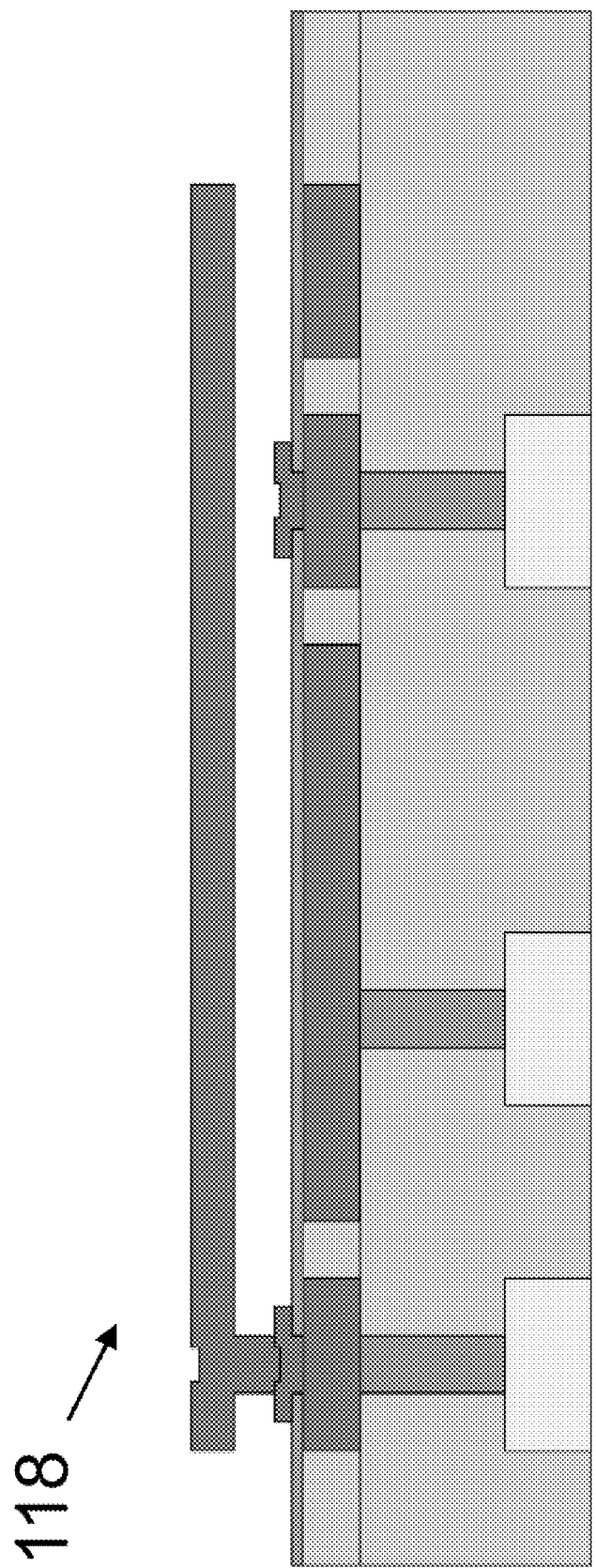

Following the deposition of the encapsulating layer 116, the cantilever switch 118 may be formed thereover as shown in FIG. 1G. In order to form the cantilever switch 118, one of the final polished electrodes 114 is exposed to provide the direct electrical connection to the cantilever of the cantilever switch 118 and a second final polished electrode 114 is exposed to be the contact electrode for the cantilever to contact when the cantilever is in the pulled-in position.

After the selected final polished electrodes 114 are exposed, the fabrication of the cantilever switch 118 continues by depositing and patterning a the electrically conductive material that connects the cantilever to the final polished electrodes at both the fixed and pulled-in locations. A first sacrificial material is deposited and patterned into the shape of the cavity within which the cantilever switch 118 will ultimately reside. The conductive material for the cantilever is then deposited and patterned to form the cantilever. A second sacrificial layer is then deposited and patterned into the shape of the cavity within which the cantilever switch 118 will ultimately reside. An encapsulating layer may then be deposited and patterned if necessary (depending upon the location where the etchant for removing the sacrificial layers is delivered). The sacrificial layers are then removed to free the cantilever and the encapsulating layer is sealed to leave the cantilever switch 118. The cantilever switch 118 is spaced apart from at least one pull-in electrode and at least one contact electrode. Thereafter, the normal processing flow may continue for the CMOS BEOL process with the cantilever switch 118 embedded therein.

The second embodiment modifies a via W-plug interconnect to form a single damascene system to fabricate CMP'ed electrodes as shown in FIGS. 2A-2E. The second embodiment involves creating a level pattern for the electrode instead of a via pattern. The electrode pattern is etched into trenches down to the underlying metal interconnect elements 200. It is to be understood that while the description below will be made with reference to a tungsten plug process, all embodiments discussed herein are equally applicable to a copper dual-damascene process whereby the copper filled vias and copper filled trenches are utilized to provide the interconnect between layers.

Figure 2A:
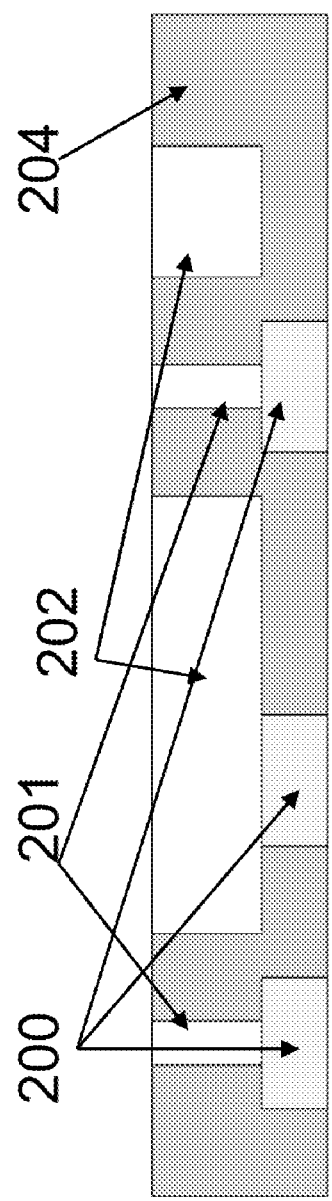

In FIG. 2A, the vias 201 are patterned into the inter-metal dielectric layer 204. The vias 201 may be locally modified to form the trenches 202 for the pull-in electrode for the cantilever while leaving the contact and anchor vias 201 as the design rule default.

Figure 2B:
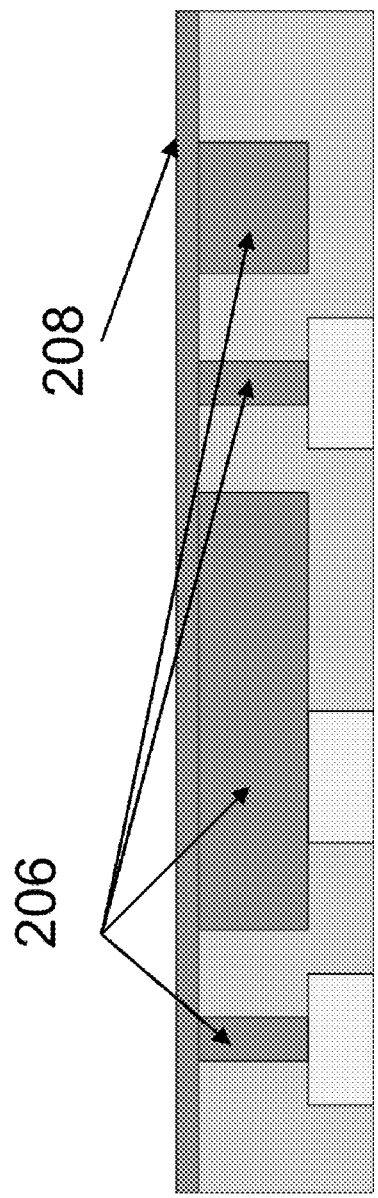

The BEOL W-Plug process is then continued, as shown in FIGS. 2B and 2C. The plug liner 206 may be deposited within the vias 201 and trenches 202 and the electrode layer 208 may be deposited over the plug liner 206 and the inter-metal dielectric layer 204. It is to be understood that the vias 201 and trenches 202 are filled with the plug liner 206 and the material of the electrode layer 208. Thus, once the electrode layer 208 is CMP'ed, the material of the electrode layer 208 will still be present within the vias 201 and trenches 202. In one embodiment, the plug liner 206 may comprise tungsten. In another embodiment, the plug liner 206 may comprise titanium. In another embodiment, the plug liner 206 may comprise titanium nitride. In another embodiment, the plug liner 206 may comprise a titanium/titanium nitride bi-layer stack. In one embodiment, the electrode layer 208 may comprise tungsten. In one embodiment, the electrode layer 208 may comprise tungsten. In another embodiment, the electrode layer 208 may comprise titanium. In another embodiment, the electrode layer 208 may comprise titanium nitride. It is to be understood that the plug liner 206 and the electrode layer 208 may comprise other electrically conductive materials as well. The electrode layer 208 may then be CMP'ed, as shown in FIG. 2C, to form the interconnect between the two metal levels such that the MEMS electrodes 210 remain.

In FIG. 2D, a thin dielectric layer 212 may be deposited. The dielectric layer 212 may comprise any conventional dielectric material conventionally utilized in a CMOS BEOL process such as silicon oxides, silicon nitride, silicon oxynitride, and combinations thereof. In one embodiment, a PECVD SiO$_2$ layer is deposited as the dielectric layer 212 to cover the MEMS electrodes 210.

Figure 2E:
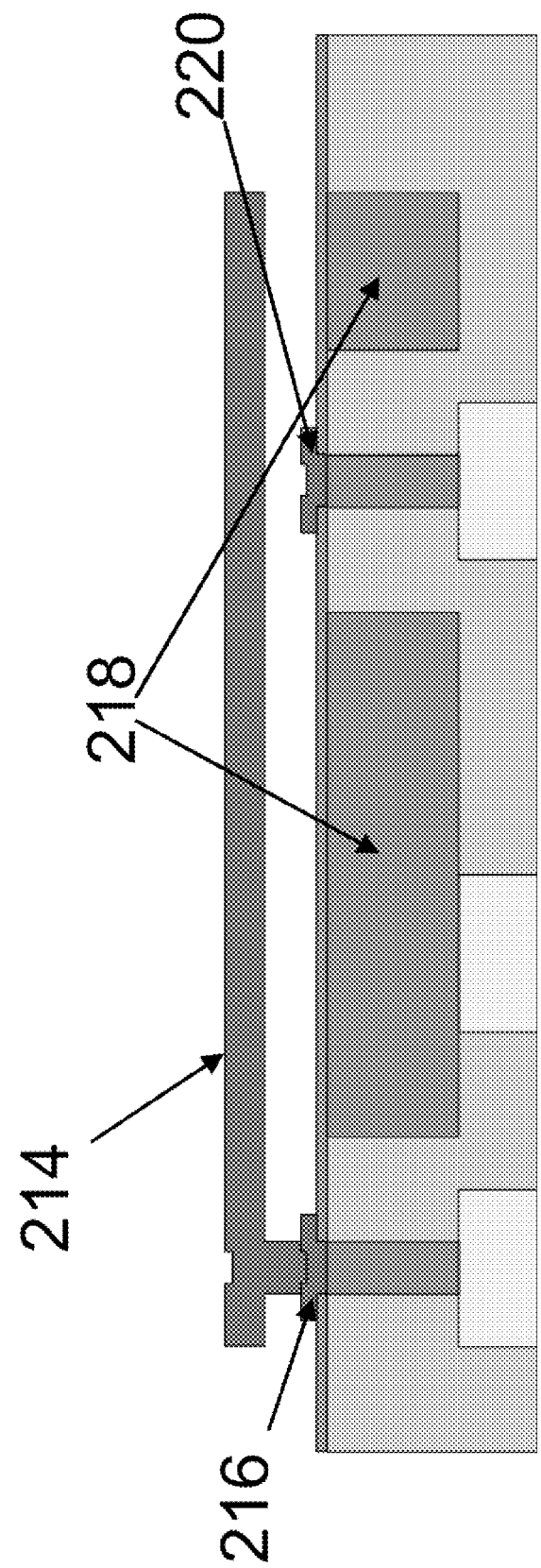

FIG. 2E shows the final released MEMS cantilever 214 connected at the anchor 216 with buried pull-in electrodes 218 and contact electrode 220 that may be fabricated as discussed above in regards to FIG. 1G.

There are some risks associated with the approach shown in the second embodiment that can impact upon the benefit of having a planarized electrode as follows. If the CMP is not managed correctly, the dishing difference between the standard vias 201 and the large electrode trenches 202 can become great enough such that the step height difference between subsequent layers and the dished electrode removes the benefit of the act of planarizing the electrodes. Additionally, when forming the trenches 202, having a significant over etch during the via etch can result in trenching down the sidewall of the underlying metal interconnect layers. This risk is mitigated by the third embodiment of this scheme.

The third embodiment uses a dual damascene approach to form the CMP'ed electrodes as shown in FIGS. 3A-3F. This embodiment improves upon the second embodiment and leverages the knowledge of Cu dual damascene technology to form the interconnect vias.

FIGS. 3A and 3B show the formation of the tungsten dual damascene interconnect utilizing a via 302 first approach with the subsequent trench 304 containing the electrode design. The vias 302 are first formed by etching the inter-metal dielectric layer 306 to expose the underlying metal interconnects 308. Thereafter, the trenches 304 are etched into the inter-metal dielectric layer 306 by etching to a predetermined depth without exposing the underlying metal interconnects 308. The inter-metal dielectric layer 306 and the metal interconnects 308 may comprise conventional materials utilized in a CMOS BEOL process.

Figure 3C:
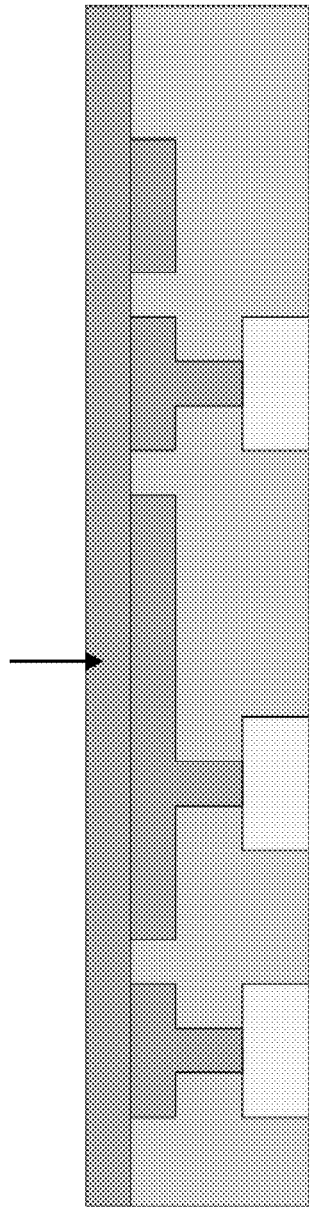

FIG. 3C continues the normal W-plug process through liner and bulk layer deposition. As shown in FIG. 3C, a liner layer (or liner layer stack) is deposited in the vias 302, the trenches 304, and potentially along the top surface of the inter-metal dielectric layer 306. Thereafter, the bulk layer may be deposited within the vias 302 to fill the vias 302 and within the trenches 304 to fill the trenches 304, and over the inter-metal dielectric layer 306 and liner (if present along the inter-metal dielectric layer 306) as an electrically conductive layer 310. In one embodiment, the liner layer may comprise titanium. In another embodiment, the liner layer may comprise titanium nitride. In another embodiment, the liner layer may comprise tungsten. In another embodiment, the liner layer may comprise an electrically conductive material. In another embodiment, the liner layer may comprise a titanium/titanium nitride stack. In one embodiment, the bulk material may comprise a material selected from the group consisting of tungsten, titanium, titanium nitride, copper, aluminium, and combinations thereof.

Figure 3D:
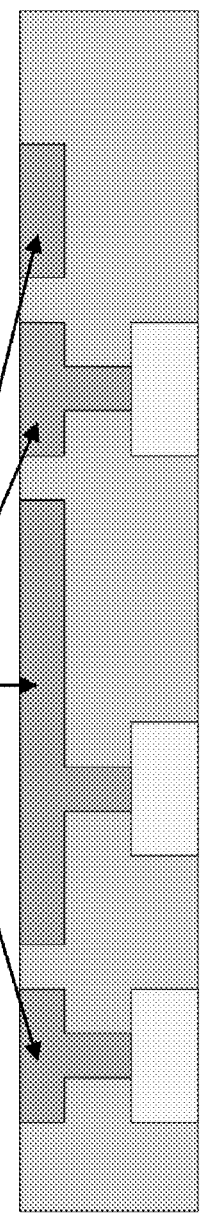
Figure 3E:
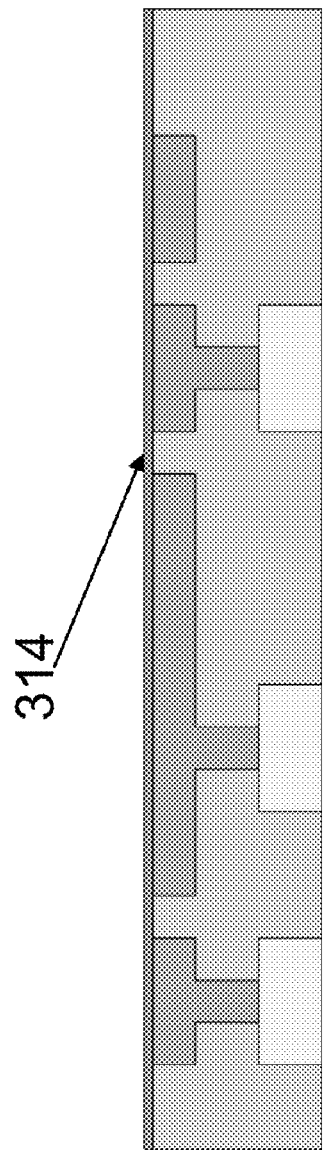
Figure 3F:
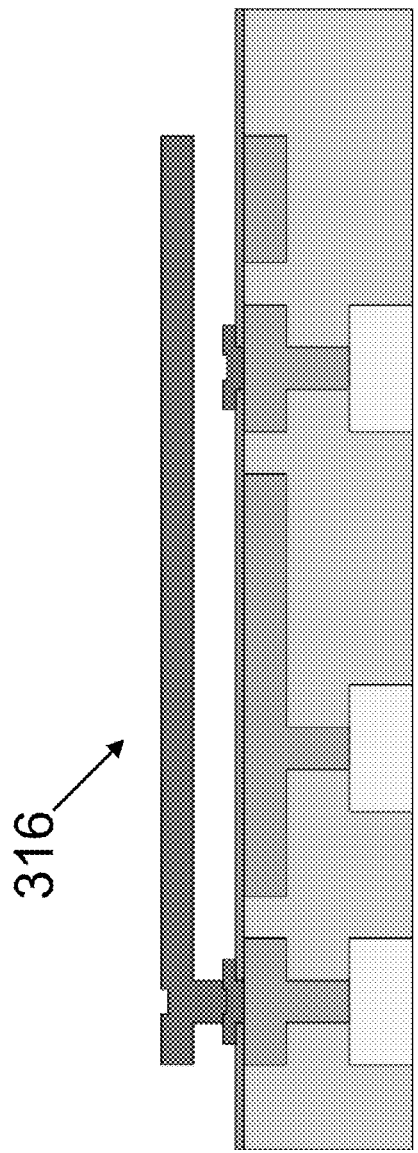

As shown in FIG. 3D, the electrically conductive layer 310 is then etched back by CMP such that the MEMS electrodes 312 remain and the inter-metal dielectric layer 306 is again exposed. In FIG. 3E, an encapsulating layer 314 may be deposited thereover. In one embodiment, the encapsulating layer 314 may comprise a material selected from silicon oxides, silicon nitride, silicon oxynitride, and combinations thereof. In one embodiment, the encapsulating layer 314 may be deposited by any conventional method typically found in CMOS BEOL processing. The encapsulating layer 314 encapsulates the MEMS electrodes 312 as well as the inter-metal dielectric layer 306. In one embodiment, the encapsulating layer 314 comprises a thin PECVD $SiO_2$ layer deposited to cover the MEMS electrodes 312. FIG. 3F shows the final released MEMS cantilever 316 that may be fabricated in a manner discussed above in regards to FIG. 1G.

As with the second embodiment, there are some risks associated with this approach that are common with Cu dual-damascene processing but the via-first or trench-first approach is well understood and is manageable. As with the second embodiment, the biggest risk is the tungsten fill and subsequent CMP.

FIGS. 4A-4E show a MEMS cantilever device 400 at various stages of production for a copper BEOL process. Vias 404 are first formed by etching the inter-metal dielectric layer 402 to expose the underlying metal interconnects 401. Thereafter, the trenches 406 are etched into the inter-metal dielectric layer 402 by etching to a predetermined depth without exposing the underlying metal interconnects 401. The inter-metal dielectric layer 402 and the metal interconnects 401 may comprise conventional materials utilized in a copper CMOS BEOL process.

A liner layer (or liner layer stack) is deposited in the vias 404, the trenches 406, and potentially along the top surface of the inter-metal dielectric layer 402. Thereafter, the bulk layer may be deposited within the vias 404 to fill the vias 404 and within the trenches 406 to fill the trenches 406, and over the inter-metal dielectric layer 402 and liner (if present along the inter-metal dielectric layer 402) as an electrically conductive layer.

Figure 4C:
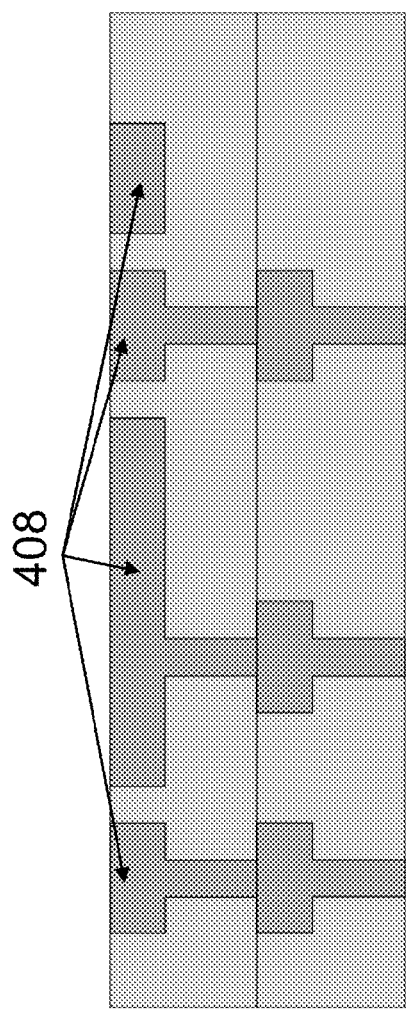
Figure 4D:
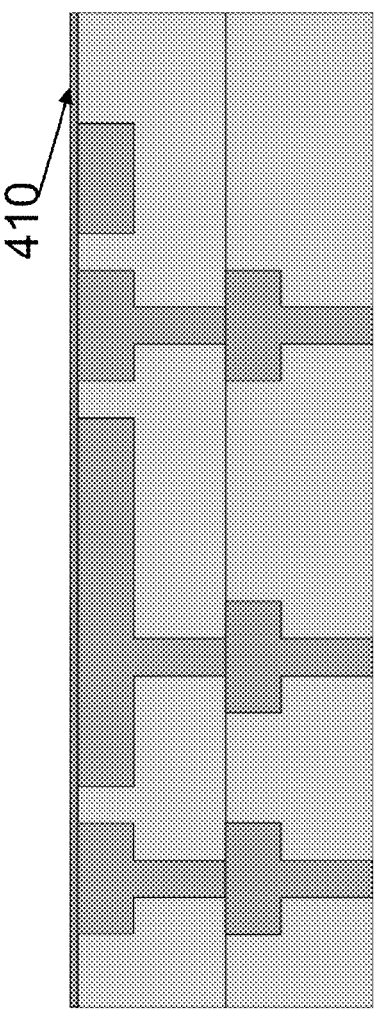
Figure 4E:
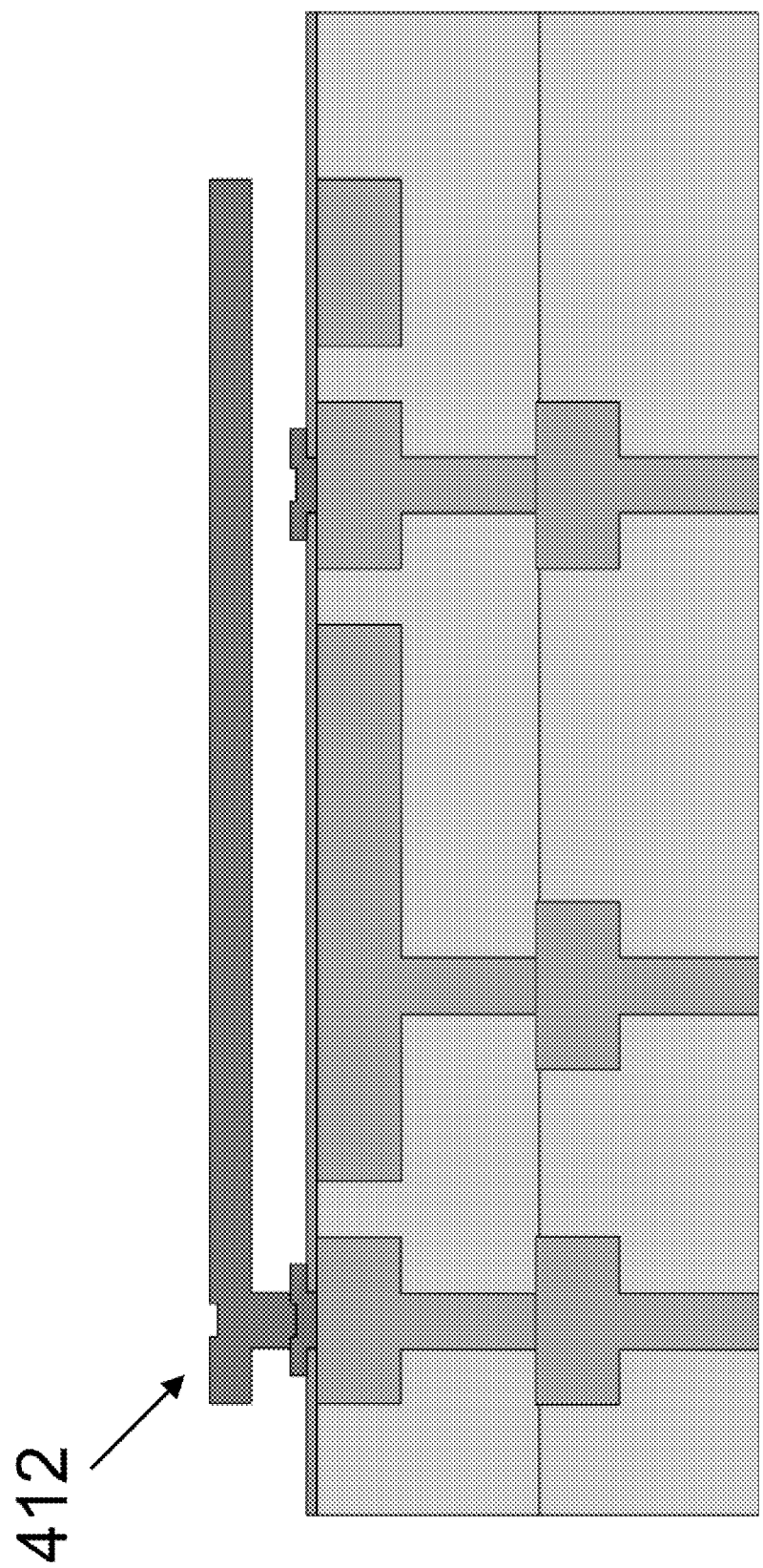

The electrically conductive layer is then etched back by CMP such that the MEMS electrodes 408 remain and the inter-metal dielectric layer 402 is again exposed. An encapsulating layer 410 may be deposited thereover. In one embodiment, the encapsulating layer 410 may comprise a material selected from silicon oxides, silicon nitride, silicon oxynitride, and combinations thereof. In one embodiment, the encapsulating layer 410 may be deposited by any conventional method typically found in CMOS BEOL processing. The encapsulating layer 410 encapsulates the MEMS electrodes 408 as well as the inter-metal dielectric layer 402. In one embodiment, the encapsulating layer 410 comprises a thin PECVD $SiO_2$ layer deposited to cover the MEMS electrodes 312. FIG. 4E shows the final released MEMS cantilever 412 that may be fabricated in a manner discussed above in regards to FIG. 1G.

There are many advantages to utilizing a CMP process to planarize the lower electrodes in a CMOS BEOL system. The electrode space is fully embedded and planarized, the mechanical performance of the MEMS device is improved, there is a greater freedom for the MEMS device design, and the industry standard oxide CMP technologies are used. Thus, a method to fabricate a MEMS device in which the lower electrode is planarized without compromising the structural integrity of the MEMS device is obtained.

While the foregoing is directed to embodiments of the present invention, other and further embodiments of the invention may be devised without departing from the basic scope thereof, and the scope thereof is determined by the claims that follow.

The invention claimed is:

1. A method, comprising:
   depositing one or more electrically conductive layers over a substrate, the substrate having a first dielectric layer with vias extending therethrough to underlying interconnect structures;
   patterning the one or more electrically conductive layers to expose at least a portion of the first dielectric layer;
   depositing a second dielectric layer over the patterned one or more electrically conductive layers and the exposed first dielectric layer;
   chemical mechanical polishing the second dielectric layer and at least a portion of the patterned electrically conductive layers to create polished electrodes;
   encapsulating the first dielectric layer and the polished electrodes; and
   forming a cantilever device that is in electrical contact with at least a portion of the polished electrodes.

2. The method of claim 1, wherein the one or more electrically conductive layers comprises a plurality of layers including:
   a first conductive layer; and
   a second conductive layer having a greater sheet resistance than the first conductive layer.

3. The method of claim 2, wherein the first conductive layer comprises aluminum-copper and the second conductive layer comprises titanium nitride.

4. The method of claim 3, wherein the first conductive layer is deposited to a thickness between about 5000 angstroms to about 9000 Angstroms and the second conductive layer is deposited to a thickness of between about 2000 Angstroms and about 3500 Angstroms.

5. The method of claim 1, wherein the second dielectric layer comprises silicon dioxide.

6. The method of claim 1, wherein the chemical mechanical polishing comprises removing between about 2000 Angstroms and about 3500 Angstroms of the one or more patterned electrically conductive layers.

7. The method of claim 1, wherein the second dielectric layer comprises high density plasma deposited tetraethylorthosilicate.

8. The method of claim 1, wherein depositing the second dielectric layer comprises depositing multiple dielectric layers.

9. The method of claim 8, wherein the multiple dielectric layers comprise a HDP-$SiO_2$ layer and a PE-TEOS layer.

10. A method, comprising:
    forming a plurality of vias through a dielectric layer formed above a substrate to expose one or more interconnect elements;
    modifying one or more vias of the plurality of vias to form one or more trenches;
    depositing one or more electrically conductive layers over the dielectric layer, over the exposed one or more interconnect elements, and within both the plurality of vias and the one or more trenches;
    chemical mechanical polishing the one or more electrically conductive layers to expose at least a portion of the dielectric layer and to form MEMS electrodes;
    encapsulating the dielectric layer and the MEMS electrodes; and
    forming a cantilever device that is in electrical contact with at least one of the MEMS electrodes.

11. The method of claim 10, wherein the one or more electrically conductive layers comprises a plurality of layers including:
    one or more liner layers; and
    a bulk layer.

12. The method of claim 11, wherein the one or more liner layers comprise titanium and the bulk layer is selected from the group consisting of copper, tungsten, and combinations thereof.

13. The method of claim 12, wherein the one or more liner layers comprise a titanium layer and a titanium nitride layer overlying the titanium layer.

14. The method of claim 10, wherein at least one trench is disposed adjacent two vias that are separate from the at least one trench.

15. The method of claim 10, wherein the cantilever device is spaced apart from the MEMS electrodes disposed within the one or more trenches.

16. The method of claim 15, wherein the cantilever device is spaced apart from at least one MEMS electrode disposed within the plurality of vias.

17. A method, comprising:
    forming one or more vias thorough a first dielectric layer to expose one or more interconnect elements;
    forming one or more trenches within the first dielectric layer such that the one or more trenches and one or more vias are connected;
    depositing one or more electrically conductive layers within the one or more vias with a first material, the one or more trenches, and over the first dielectric layer;
    chemical mechanical polishing the one or more electrically conductive layers to expose the first dielectric layer and to form one or more MEMS electrodes within the one or more trenches;
    encapsulating the first dielectric layer and the one or more MEMS electrodes; and
    forming a cantilever device that is in electrical contact with the one or more MEMS electrodes.

18. The method of claim 17, wherein the one or more electrically conductive layers comprises a plurality of layers including:
    one or more liner layers; and
    a bulk layer.

19. The method of claim 18, wherein the one or more liner layers comprise titanium and the bulk layer is selected from the group consisting of copper, tungsten, and combinations thereof.

20. The method of claim 19, wherein the one or more liner layers comprise a titanium layer and a titanium nitride layer overlying the titanium layer.

* * * * *